(12) United States Patent
Farrell

(10) Patent No.: US 11,024,445 B2
(45) Date of Patent: Jun. 1, 2021

(54) POWER CABLE WITH AN OVERMOLDED PROBE FOR POWER TRANSFER TO A NON-THERMAL PLASMA GENERATOR AND A METHOD FOR CONSTRUCTING THE OVERMOLDED PROBE

(71) Applicant: Volt Holdings, LLC, Rochester, NY (US)

(72) Inventor: Peter Farrell, Rochester, NY (US)

(*) Notice: Subject to any disclaimer, the term of this patent is extended or adjusted under 35 U.S.C. 154(b) by 0 days.

(21) Appl. No.: 16/567,517

(22) Filed: Sep. 11, 2019

(65) Prior Publication Data

US 2020/0090910 A1 Mar. 19, 2020

Related U.S. Application Data

(60) Provisional application No. 62/731,462, filed on Sep. 14, 2018, provisional application No. 62/735,802, filed on Sep. 24, 2018, provisional application No. 62/876,123, filed on Jul. 19, 2019.

(51) Int. Cl.
| | | |
|---|---|---|
| *B01D 53/94* | (2006.01) |
| *H01B 7/02* | (2006.01) |
| *F01N 3/023* | (2006.01) |
| *H01J 37/32* | (2006.01) |
| *H01B 13/06* | (2006.01) |
| *H01B 9/00* | (2006.01) |

(52) U.S. Cl.
CPC ....... *H01B 7/0216* (2013.01); *B01D 53/9431* (2013.01); *F01N 3/023* (2013.01); *H01B 7/0225* (2013.01); *H01B 7/0266* (2013.01); *H01B 9/00* (2013.01); *H01B 13/06* (2013.01); *H01J 37/32027* (2013.01); *H01J 37/32577* (2013.01); *H01J 37/32798* (2013.01); *F01N 2240/28* (2013.01)

(58) Field of Classification Search
CPC .... H01B 7/0216; H01B 7/0225; H01B 13/06; H01J 37/32559; H01J 37/32577; B01D 53/9431
USPC ......................................................... 313/510
See application file for complete search history.

(56) References Cited

U.S. PATENT DOCUMENTS

| | | | |
|---|---|---|---|
| 4,694,222 A * | 9/1987 | Wakalopulos | H01J 3/021 315/111.21 |
| 8,097,072 B1 * | 1/2012 | Taylor | F01N 13/009 96/55 |
| 8,128,884 B2 | 3/2012 | Min et al. | |
| 8,157,902 B2 | 4/2012 | Ogut et al. | |
| 8,544,257 B2 | 10/2013 | Hamade | |
| 8,696,996 B2 | 4/2014 | Albrecht et al. | |
| 8,771,600 B2 | 7/2014 | Ray | |
| 9,260,998 B1 | 2/2016 | Rieger et al. | |

(Continued)

*Primary Examiner* — Christopher M Raabe
(74) *Attorney, Agent, or Firm* — Michael J. Nickerson; Basch & Nickerson LLP

(57) ABSTRACT

A transfer module for transferring power to a non-thermal plasma generator includes a power cable; a first epoxy; a second epoxy; an interface between the first epoxy and the second epoxy; and a well; the power cable including a conductor for conducting electrical power and an insulation layer for surrounding a portion of the conductor; the first epoxy being located within the well to surround the insulation layer; the second epoxy being located within the well to surround the conductor located within the well; the second epoxy being located outside the well to surround the conductor located outside the well.

8 Claims, 20 Drawing Sheets

(56) References Cited

U.S. PATENT DOCUMENTS

| | | |
|---|---|---|
| 9,376,948 B2 | 6/2016 | Kim et al. |
| 9,388,717 B2 | 7/2016 | Taylor |
| 9,445,488 B2 | 9/2016 | Foret |
| 9,586,178 B2 | 3/2017 | Bao et al. |
| 9,920,671 B2 | 3/2018 | Rieger et al. |
| 10,638,592 B2 * | 4/2020 | Foret .................... H05H 1/26 |
| 10,896,771 B2 * | 1/2021 | Farrell ................ F01N 3/0275 |
| 2011/0235239 A1 | 9/2011 | Teske |
| 2012/0210968 A1 | 8/2012 | Burrows et al. |
| 2016/0148723 A1 * | 5/2016 | Hazelton .............. H01B 7/0225 174/70 R |
| 2018/0240743 A1 | 8/2018 | Lee et al. |
| 2020/0090833 A1 * | 3/2020 | Farrell .................. F01N 3/023 |

\* cited by examiner

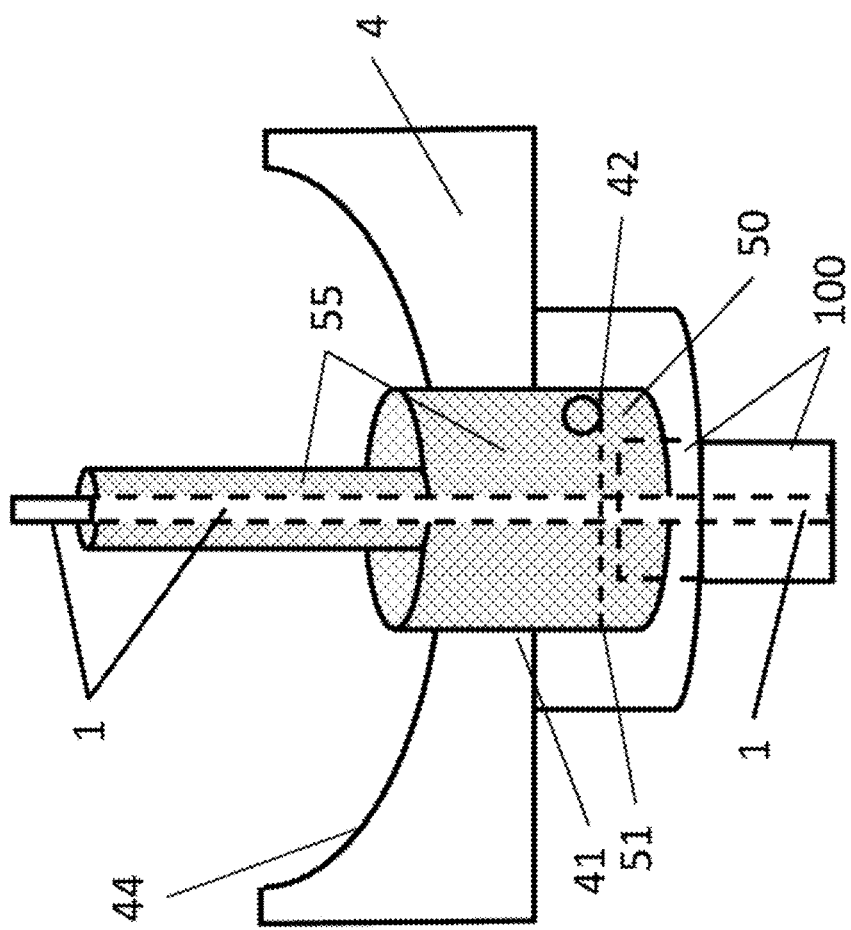

POWER CABLE WITH AN OVERMOLDED PROBE FOR POWER TRANSFER TO A NON-THERMAL PLASMA GENERATOR AND A METHOD FOR CONSTRUCTING THE OVERMOLDED PROBE

PRIORITY INFORMATION

The present application claims priority, under 35 U.S.C. § 119(e), from U.S. Provisional patent application, Ser. No. 62/731,462, filed on Sep. 14, 2018. The entire content of U.S. Provisional patent application, Ser. No. 62/731,462, filed on Sep. 14, 2018, is hereby incorporated by reference.

The present application claims priority, under 35 U.S.C. § 119(e), from U.S. Provisional patent application, Ser. No. 62/735,802, filed on Sep. 24, 2018. The entire content of U.S. Provisional patent application, Ser. No. 62/735,802, filed on Sep. 24, 2018, is hereby incorporated by reference.

The present application claims priority, under 35 U.S.C. § 119(e), from U.S. Provisional patent application, Ser. No. 62/876,123, filed on Jul. 19, 2019. The entire content of U.S. Provisional patent application, Ser. No. 62/876,123, filed on Jul. 19, 2019, is hereby incorporated by reference.

BACKGROUND

Current methods for control of emissions in diesel engines have been expanded and facilitated by the development of non-thermal plasma treatment methods and systems for use in the exhaust stream of such engines.

A plasma is an ionized gas where positive and negative ions are intermixed. A thermal plasma (such as one created by an electric arc) is generally "hot" and evenly heated.

A non-thermal plasma (such as one created in a neon lamp) is one where the electrons are "hot" while its other components are, by comparison, "cold."

FIG. 1 provides a basic schematic view of an example of a conventional dielectric-barrier discharge system for generating non-thermal plasma.

FIG. 2 provides a basic schematic view of an example of a conventional pulsed or DC corona discharge system for generating non-thermal plasma.

FIG. 3, which shows a schematic diagram for the use of non-thermal plasma generators ("CHAMBER") as part of an exhaust gas recirculation system (EGR) used for exhaust gas treatment in conjunction with an internal combustion engine. A POWER SUPPLY is shown for the system.

The development of non-thermal plasma (hereafter "NTP") as a method for treating the exhaust gases of internal combustion engines is disclosed in the U.S. Pat. Nos. 9,260,998 and 9,920,671.

The entire content of U.S. Pat. No. 9,260,998 is hereby incorporated by reference. The entire content of U.S. Pat. No. 9,920,671 is hereby incorporated by reference.

Products that employ non-thermal plasma need an apparatus, method, and/or system to transfer power from an independent source, such as a high voltage power supply, into the reactor generating non-thermal plasma in an exhaust stream.

An example of an apparatus, method, and/or system to transfer power from an independent source into the reactor generating non-thermal plasma is set forth in U.S. Pat. No. 6,368,451. U.S. Pat. No. 6,368,451 uses a "Feedthrough" that provides as a link between a power cable and the interior of a chamber where the power being provided via the cable is put to use. The entire content of U.S. Pat. No. 6,368,451 is hereby incorporated by reference.

Notwithstanding the examples, discussed above, the conventional cables adapted for direct transfer of high voltage power from a power source through the exterior wall and to the harsh conditions of a non-thermal plasma reactor do not have a high survival rate in the harsh conditions required to maximize soot reduction from a diesel engine.

Therefore, it is desirable to provide a cable adapted for direct transfer of high voltage power from a power source through the exterior wall and to the harsh conditions of a non-thermal plasma reactor without terminating the cable exterior to the non-thermal plasma reactor.

It is further desirable to provide a cable adapted for direct transfer of high voltage power from a power source through the exterior wall and to the harsh conditions of a non-thermal plasma reactor without connecting the cable to contacts located on the exterior of the non-thermal plasma reactor.

It is further desirable to provide a cable adapted for direct transfer of high voltage power from a power source through the exterior wall and to the harsh conditions of a non-thermal plasma reactor without connecting the cable to an intermediate high voltage feedthrough connector.

BRIEF DESCRIPTION OF THE DRAWINGS

The drawings are only for purposes of illustrating various embodiments and are not to be construed as limiting, wherein:

FIG. 20 illustrates an example of an epoxy coated cable interfacing with a transfer module for a non-thermal plasma generation chamber.

DESCRIPTION OF THE DRAWINGS

Figure 1:
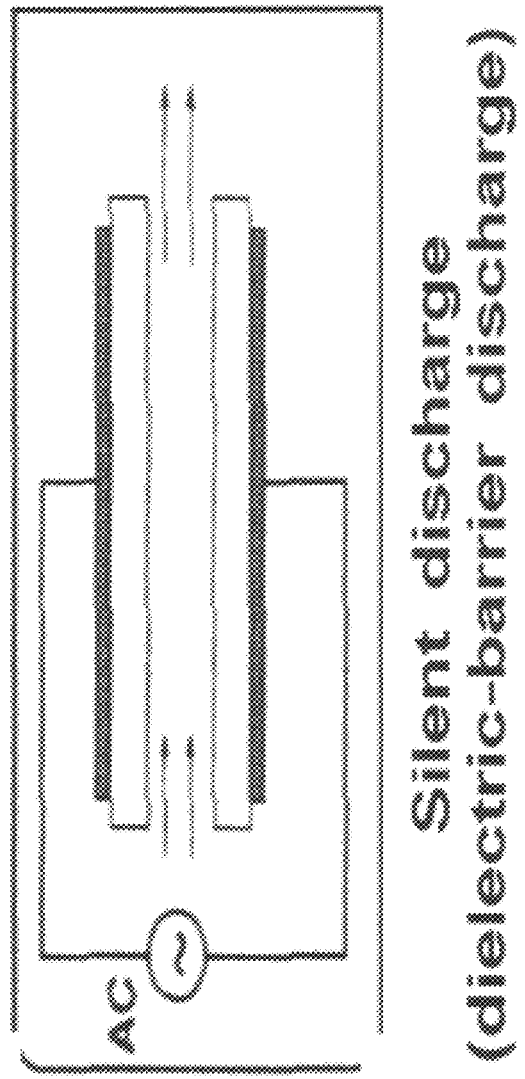
FIG. 1 is a basic schematic view of an example of a conventional dielectric-barrier discharge system for generating non-thermal plasma.
Figure 2:
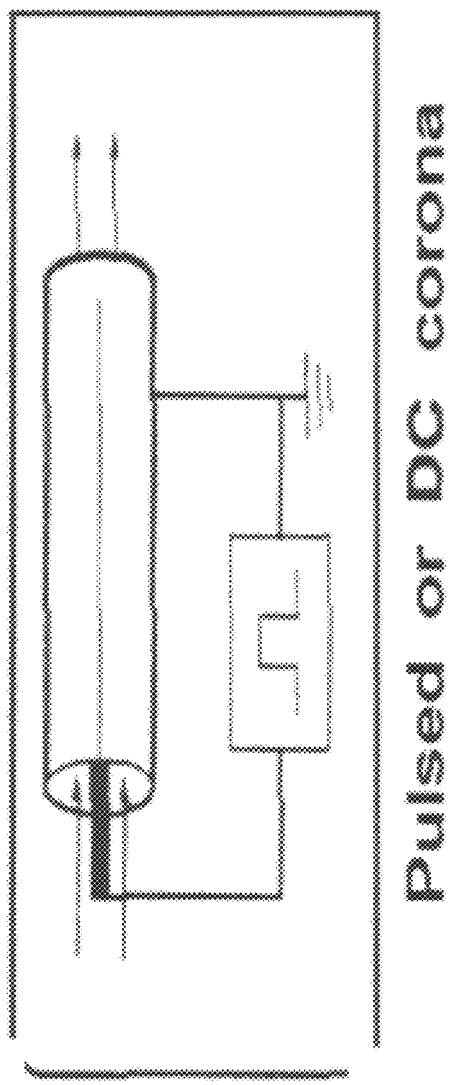
FIG. 2 is a basic schematic view of an example of a conventional pulsed or DC corona discharge system for generating non-thermal plasma.
Figure 3:
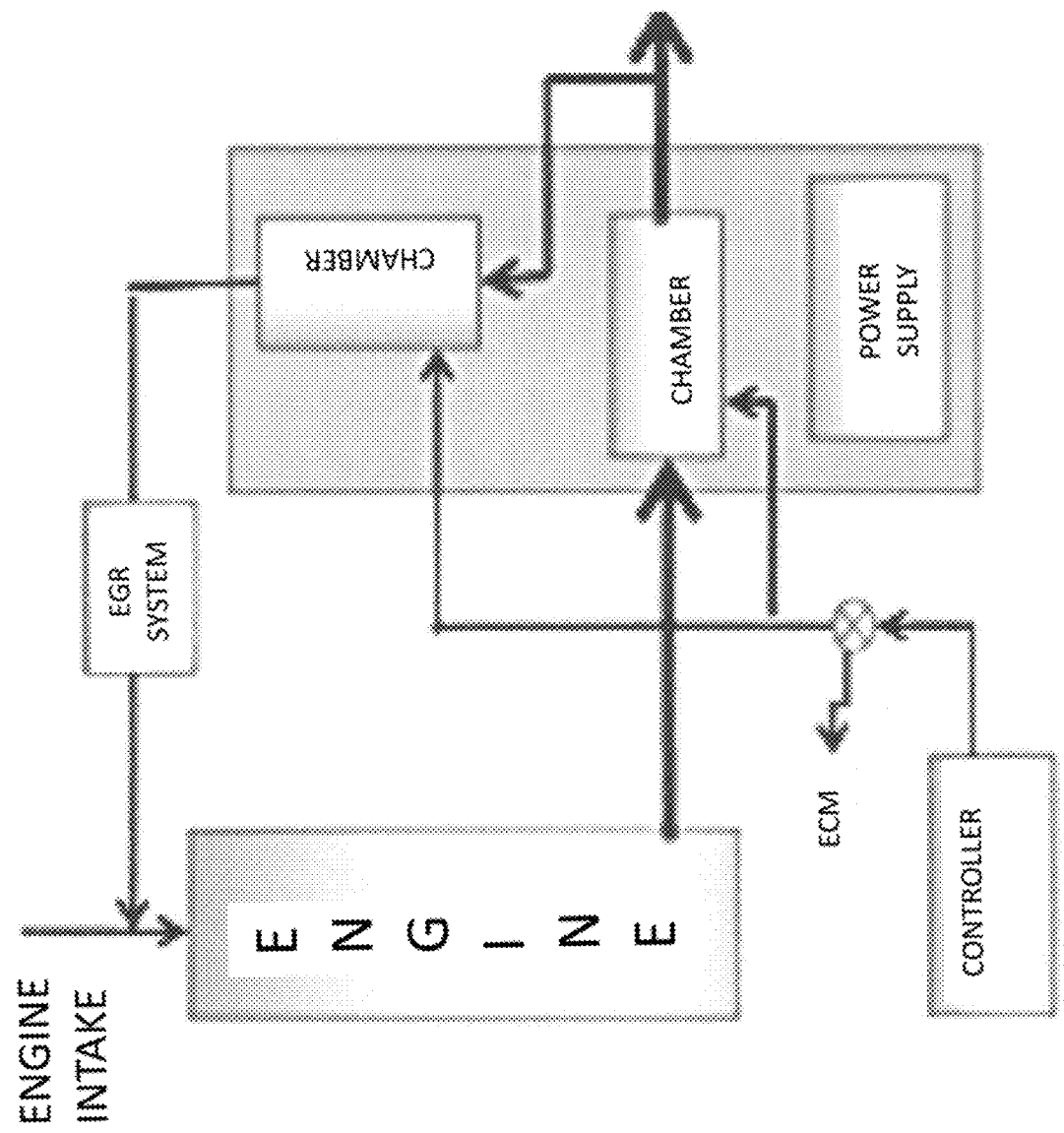
FIG. 3 is a schematic view of the application of non-thermal plasma in the context of treating engine emissions.

For a general understanding, reference is made to the drawings. In the drawings, like references have been used throughout to designate identical or equivalent elements. It is also noted that the drawings may not have been drawn to scale and that certain regions may have been purposely drawn disproportionately so that the features and concepts may be properly illustrated.

As described below, a high voltage power cable (1) provides power transfer to any device which employs high voltage up to 35 kV to produce non-thermal plasma; (2) transfers high voltage directly to the interior of non-thermal plasma reactor chambers; (3) is capable of being inserted into an exhaust stream from an engine or power plant which contains noxious gases and particulate matter at temperatures as high as 1000° F.; (4) provides high voltage power transfer to a non-thermal plasma in one or more channels of an exhaust emission treatment system; (5) safely transfers high voltage power from a power supply of at least 35 kV through any chamber or container operating at pressures of at least 35 psi and transferring noxious gases and liquids; and/or (6) safely transfers high voltage power from a power supply of at least 35 kV through any chamber or container operating at pressures of at least 35 psi and transferring noxious gases or other invasive fluids by inserting the high voltage cable directly into the fluid stream or stationary environment within the chamber or container.

Figure 4:
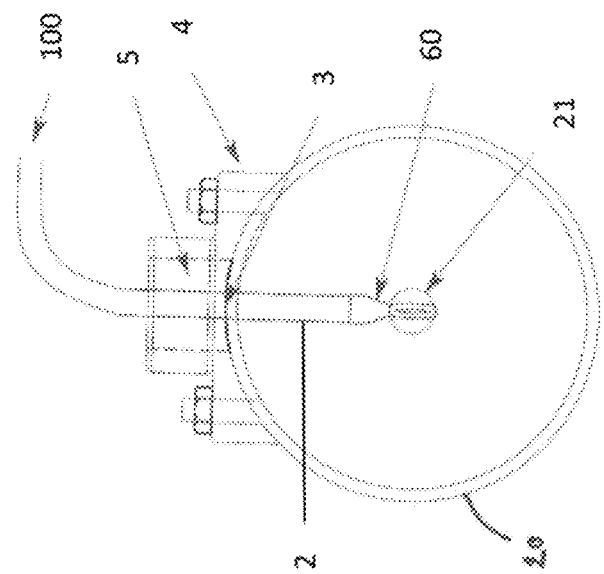
FIG. 4 is a cross-section illustrating a cable interfacing with a non-thermal plasma generation chamber.

FIG. 4 illustrates a cable 100 interfaces with a non-thermal plasma generation chamber 20. As illustrated, the power conductor and surrounding insulation layer 2 of the power cable 100 penetrates the wall of chamber 20 and interfaces with anode shaft 21, linking the power supply of up to 35 kV and 350 watts to the emitter (anode shaft 21) inside of the reactor chamber 20 via banana clip 60. In other words, the conducting core of cable 100 provides an unbroken link between the power supply and the emitter.

The high voltage cable 100, namely the power conductor and surrounding insulation layer 2 of the power cable 100, passes though the transfer module 4, shown at the top of the reactor 20, which is sealed to non-thermal plasma reactor's wall, thereby isolating the power conductor and surrounding insulation layer 2 of the power cable 100 from its surroundings and insulating those surroundings from the high voltage being transferred along the power conductor of the power cable 100.

The conducting core of high voltage cable 100 extends directly into the exhaust stream and joins with the anode/emitter shaft 21, thereby energizing the anode/emitter shaft 21 to produce non-thermal plasma within the reactor 20 and avoiding arcing issues. Extremely hot exhaust gases flowing from the exhaust source passing through the reactor 20 and being treated by non-thermal plasma to remove particulate matter in the reactor 20 are also effectively sealed in and contained by transfer module 4 within reactor 20 while the particulate matter is converted to carbon dioxide and water, which then exits the reactor 20.

Figure 5:
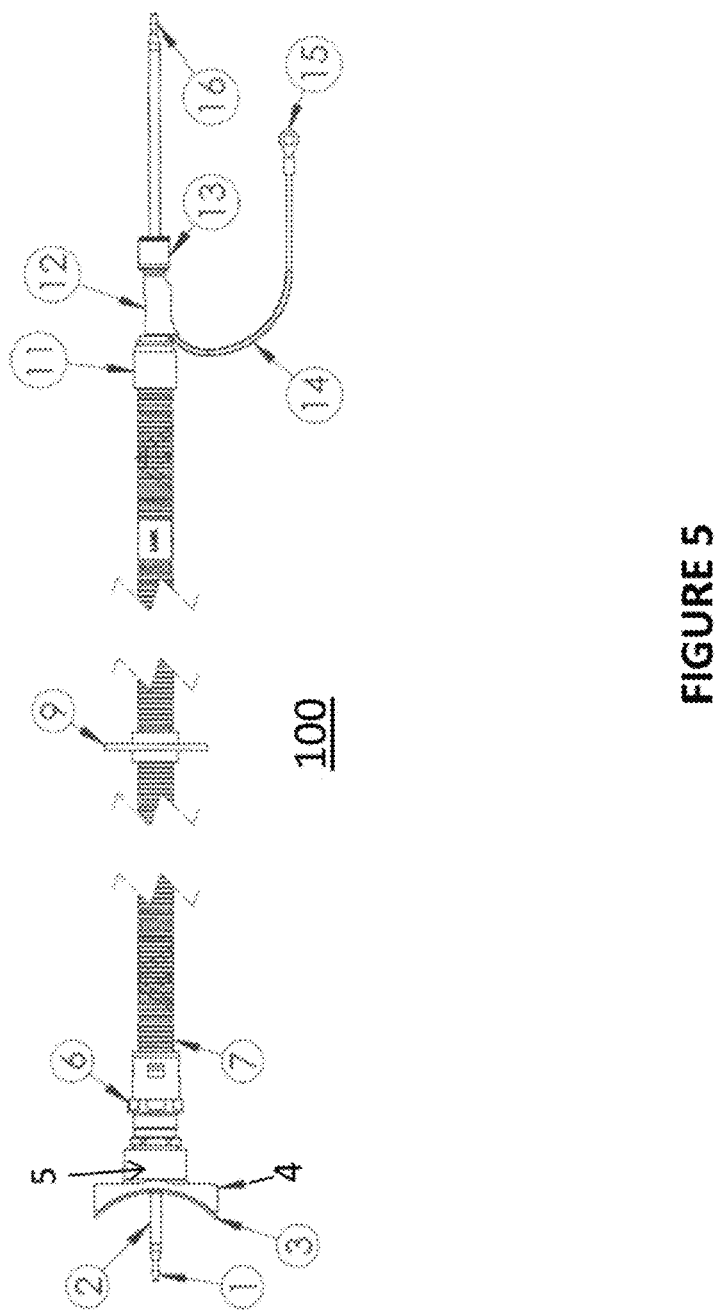
FIG. 5 illustrates a cable for interfacing with a non-thermal plasma generation chamber.

The cable 100 is illustrated in more detail in FIG. 5. As illustrated in FIG. 5, a flexible cable 100 includes a power supply end designed to interface with a power supply and a reactor end designed to interface and form a seal with an non-thermal plasma reactor's wall via epoxy insulator 5 and gasket/O-ring seal 3.

The epoxy insulator 5 and gasket/O-ring seal 3 allows the conducting core 1 of cable 100 and insulation layer 2 to extend in an unbroken manner through an opening in the non-thermal plasma reactor's wall to interface directly with anode shaft, thereby effectively isolating conductor core 1 environmentally and/or electrically, so as to eliminate environmentally and/or electrically leakage (i.e., preventing arcing and corona).

The material/construction used for insulation layer 2 should be able to withstand 20,000 Volts DC continuously, temperatures up to 250 F, noxious gases at pressures up to 30 psi, and/or the moisture present in engine exhaust. In one embodiment, the insulation layer 2 is a semi-solid fluorinated ethylene-propylene (FEP) wrapped with silicone.

As further illustrated in FIG. 5, the cable 100 includes a loom connector 6, loom/conduit surrounding jacket 7, fire stop 9 for interfacing with a vehicle fire wall, loom end cap 11, heat shrunk tubing 12, UHF plug 13, conducting wire 14, terminal ring 15, and banana plug 16 to connect the copper conductor 1 in center of cable 100 to a power supply.

Figure 6:
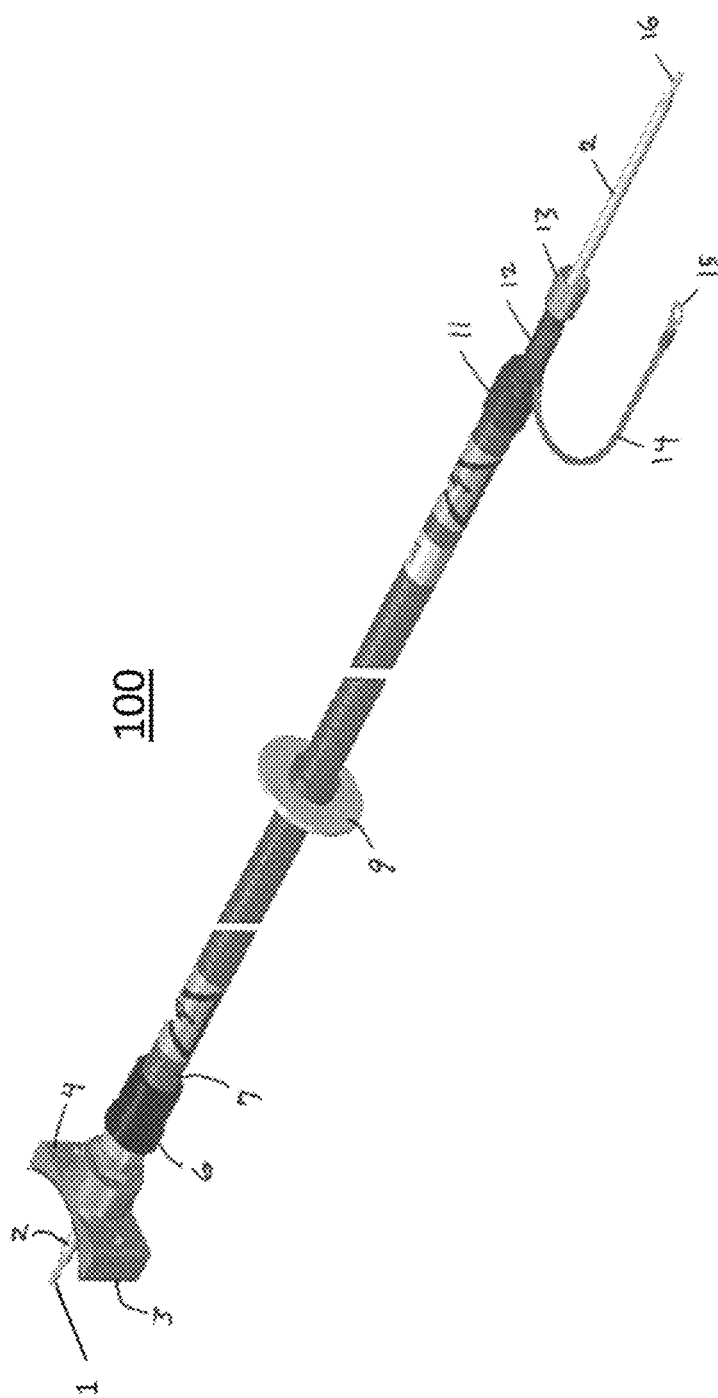
FIG. 6 illustrates a cable for interfacing with a non-thermal plasma generation chamber.

The cable 100 is illustrated in more detail in FIG. 6. As illustrated in FIG. 6, a flexible cable 100 includes a power supply end designed to interface with a power supply and a reactor end designed to interface and form a seal with a non-thermal plasma reactor's wall via epoxy insulator 5 and gasket/O-ring seal 3. The epoxy insulator 5 and gasket/O-ring seal 3 allows the conducting core 1 of cable 100 and insulation layer 2 to extend in an unbroken manner through an opening in the non-thermal plasma reactor's wall to interface directly with anode shaft, thereby effectively isolating conductor core 1 environmentally and/or electrically, so as to eliminate environmentally and/or electrically leakage (i.e., preventing arcing and corona).

The material/construction used for insulation layer 2 should be able to withstand 20,000 Volts DC continuously, temperatures up to 250 F, noxious gases at pressures up to 30 psi, and/or the moisture present in engine exhaust. In one embodiment, the insulation layer 2 is a semi-solid fluorinated ethylene-propylene (FEP) wrapped with silicone.

As further illustrated in FIG. 6, the cable 100 includes a loom connector 6, loom/conduit surrounding jacket 7, fire stop 9 for interfacing with a vehicle fire wall, loom end cap 11, heat shrunk tubing 12, UHF plug 13, conducting wire 14, terminal ring 15, and banana plug 16 to connect the copper conductor 1 in center of cable 100 to a power supply.

Figure 7:
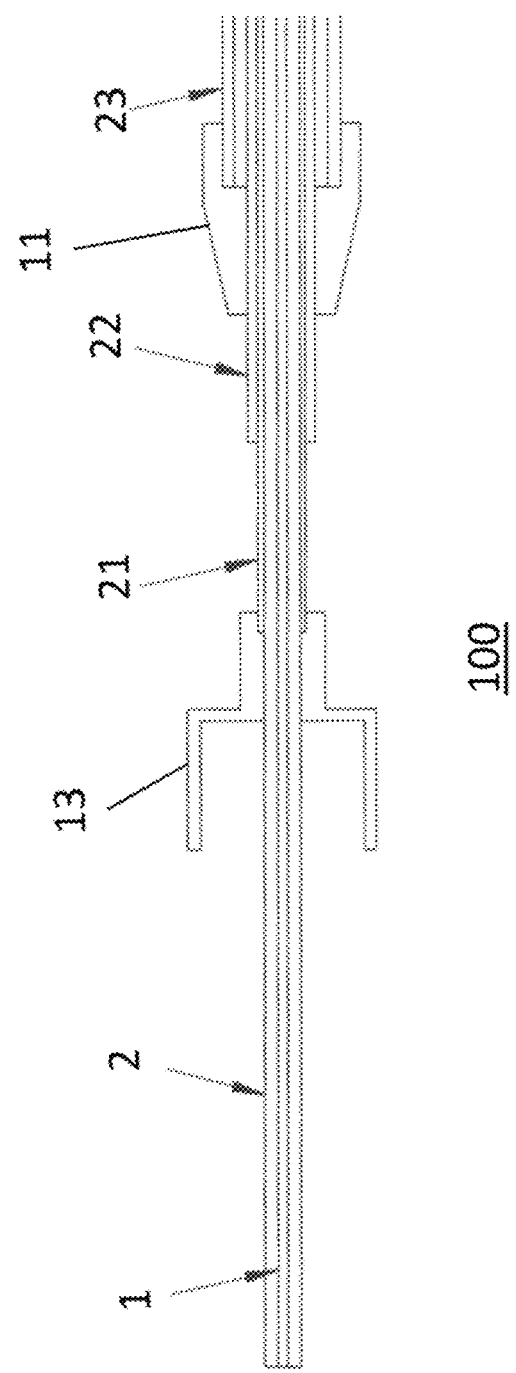
FIG. 7 illustrates a power supply end of the cable for interfacing with a non-thermal plasma generation chamber.
Figure 8:
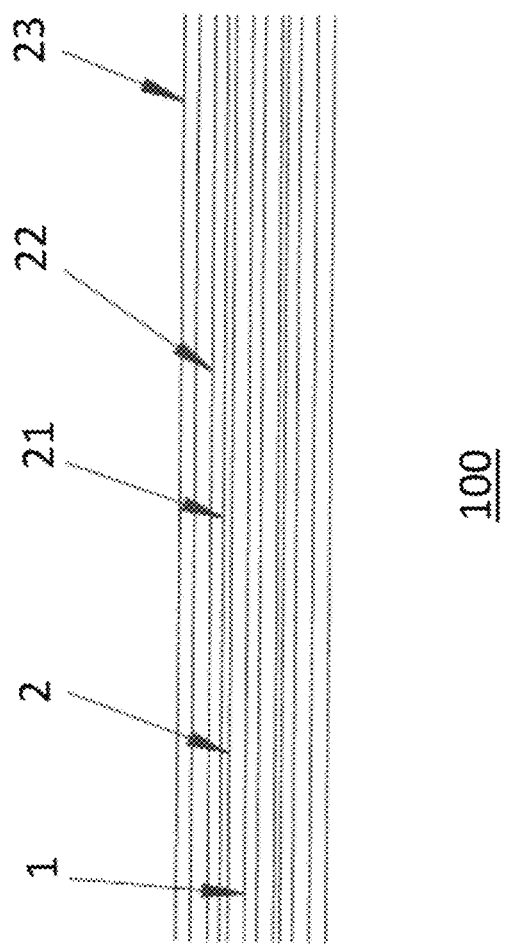
FIG. 8 illustrates a mid-section of the cable for interfacing with a non-thermal plasma generation chamber.

FIG. 7 illustrates a power supply end of the power cable 100. The power cable 100 consists of a conductor 1 surrounded by an insulation layer 2. The insulation layer 2 is surrounded by impregnated glass braid jacket 21. Impregnated glass braid jacket 21 is surrounded by braid 22, and braid 22 is surrounded by conduit 23. In other words, as illustrated in FIG. 8, the power cable 100 is comprised of a conductor 1, an insulation layer 2, an impregnated glass braid jacket 21, a braid 22, and a conduit 23.

The various layers are peeled away as the cable interfaces with various components. For example, as illustrated in FIG. 7, the conduit 23 does not extend beyond the loom end cap 11, and the impregnated glass braid jacket 21 does not extend beyond the UHF plug 13.

Figure 9:
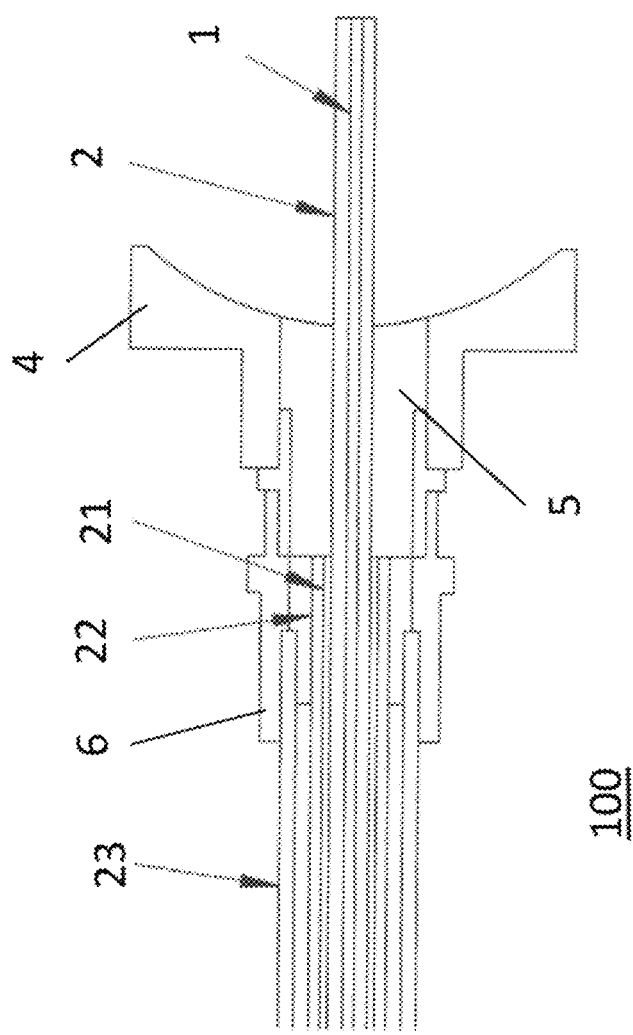
FIG. 9 illustrates a reactor end of the cable for interfacing with a non-thermal plasma generation chamber.

FIG. 9 illustrates a power supply end of the power cable 100. The power cable 100 consists of a conductor 1 surrounded by an insulation layer 2. The insulation layer 2 is surrounded by impregnated glass braid jacket 21. Impregnated glass braid jacket 21 is surrounded by braid 22, and braid 22 is surrounded by conduit 23.

The various layers are peeled away as the cable interfaces with various components. For example, as illustrated in FIG. 9, the conduit 23 does not extend beyond the loom connector 6, and the impregnated glass braid jacket 21 does not extend beyond the transfer module 4. As further illustrated in FIG. 9, the conductor 1 surrounded by the insulation layer 2 extends through epoxy 5.

Figure 10:
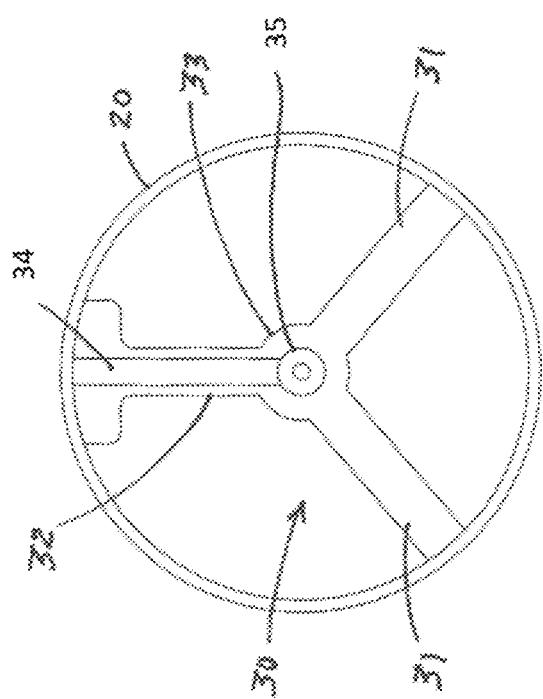
FIG. 10 illustrates a cable envelope for the cable within a non-thermal plasma generation reactor.
Figure 11:
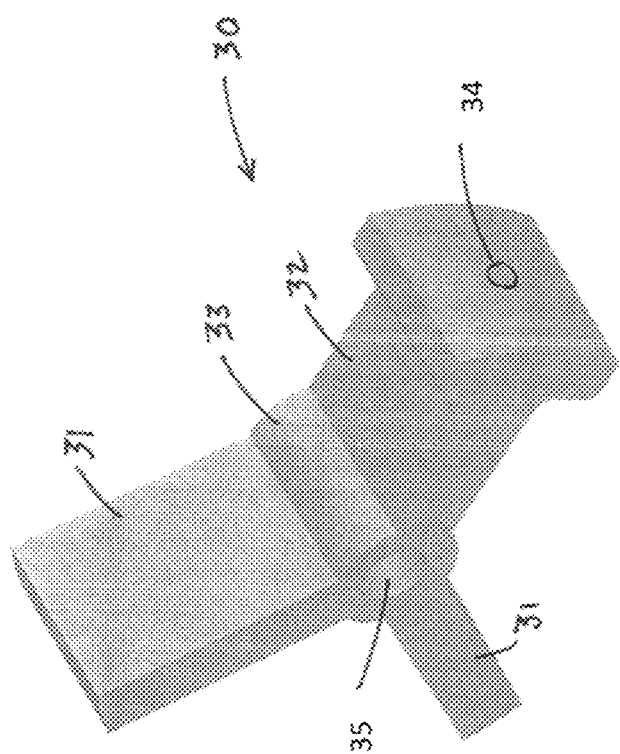
FIG. 11 illustrates the cable envelope for the cable.

FIGS. 10 and 11 illustrate a cable envelope 30, which further isolates conductor core 1 in the types of extreme environments contemplated for its operation. As noted below, envelope 30 serves multiple purposes and includes three equally spaced radial legs 31, 31, and 32 by which envelope 30 is braced in position against the inner wall of reactor chamber 20. Radial legs 31, 31, and 32 converge on a center section 33, which includes an axial bore 35 adapted for inclusion of an anode (not shown) and an intersecting radial bore 34 in leg 32 configured as an enclosed channel from chamber wall 20 to the anode, thereby protecting and shielding the power cable conductor (not shown) and insulation layer (not shown) running to the anode of the plasma reactor 20.

The cable envelope 30 may be constructed of borosilicate glass, a type of glass with silica and boron trioxide as the main glass-forming constituents. Borosilicate glasses are known for having very low coefficients of thermal expansion (approximately 3×10K at 20 C.), making borosilicate glass more resistant to thermal shock than any other common glass. Such glass is less subject to thermal stress.

In a further embodiment, the glass surfaces exposed to, for example, carbonaceous gases may be coated with titanium dioxide to create "slippery glass" that resists build-up of residues and shields the glass from moisture degradation.

Figure 12:
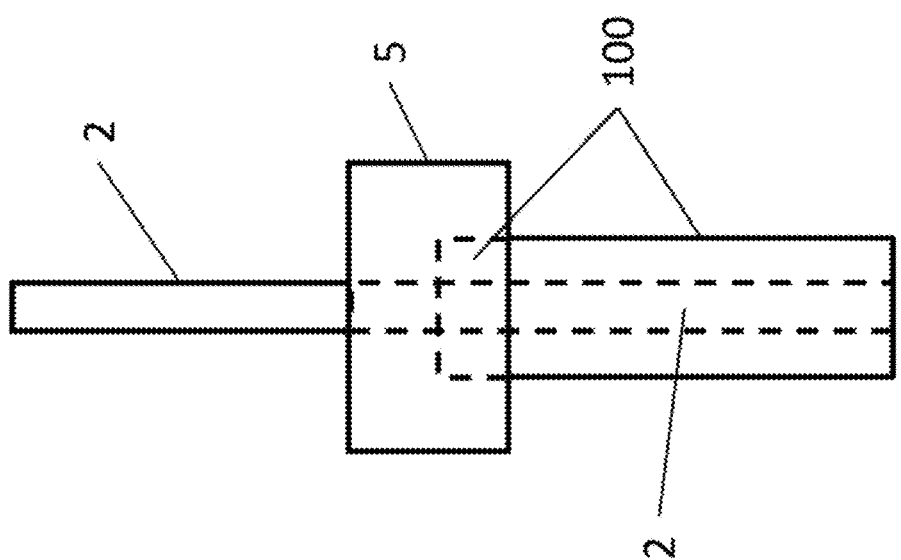
FIG. 12 illustrates an example of an epoxy coated cable for interfacing with a transfer module for a non-thermal plasma generation chamber.

FIG. 12 illustrates an example of an epoxy coated cable for interfacing with a transfer module for a non-thermal plasma generation chamber. As illustrated in FIG. 12, a power cable 100, having an insulation layer 2 with a conductor therein, extends into a portion of an epoxy 5. The insulation layer 2 with the conductor therein extends, from an end portion of the power cable 100, through the epoxy 5. The portion of the insulation layer 2 with the conductor extending out of the epoxy 5 provides a connection to an anode within a plasma reactor.

Figure 13:
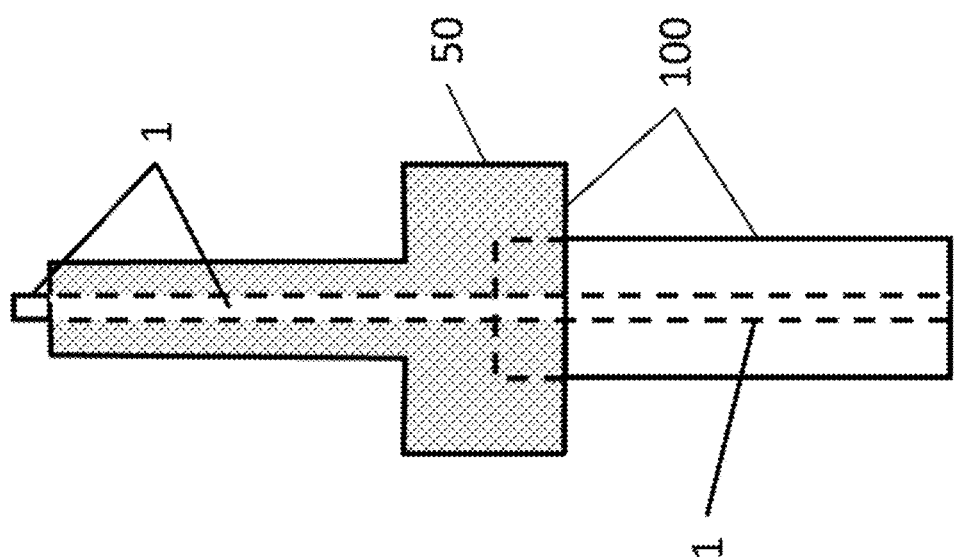
FIG. 13 illustrates another example of an epoxy coated cable for interfacing with a transfer module for a non-thermal plasma generation chamber.

FIG. 13 illustrates another example of an epoxy coated cable for interfacing with a transfer module for a non-thermal plasma generation chamber. As illustrated in FIG. 13, a power cable 100, having a conductor 1 therein, extends into a portion of an epoxy 5. The conductor 1 therein extends, from an end portion of the power cable 100, through the epoxy 5.

As illustrated in FIG. 13, a portion of the epoxy 5 only surrounds the conductor 1, wherein a further portion of the portion of the epoxy 5 that only surrounds the conductor 1 has a smaller outer diametric dimension than an outer diametric dimension of the portion of the epoxy 5 that surrounds the power cable 100. The portion of the conductor 1 extending out of the epoxy 5 provides a connection to an anode within a plasma reactor.

Figure 14:
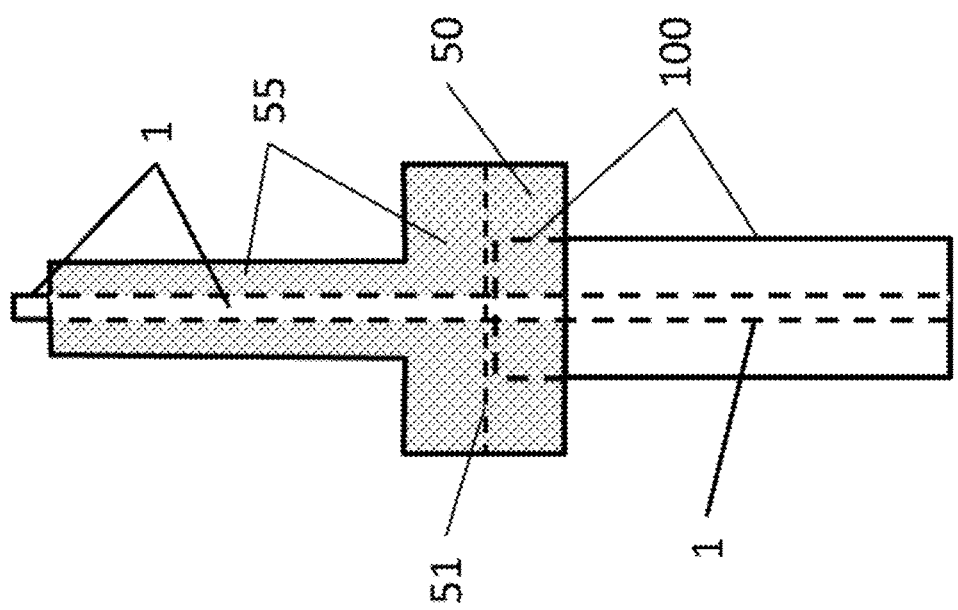
FIG. 14 illustrates another example of an epoxy coated cable for interfacing with a transfer module for a non-thermal plasma generation chamber.

FIG. 14 illustrates another example of an epoxy coated cable for interfacing with a transfer module for a non-thermal plasma generation chamber. As illustrated in FIG. 14, a power cable 100, having a conductor 1 therein, extends into a portion of epoxy 50. The conductor 1 therein extends, from an end portion of the power cable 100, through an epoxy 55. Epoxy 50 and epoxy 55 has an interface or physical boundary 51 therebetween indicating that epoxy 50 and epoxy 55 were formed at different times, as will be described in more detail below.

As illustrated in FIG. 14, epoxy 55 may only surround the conductor 1. Moreover, a further portion of epoxy 55 has a smaller outer diametric dimension than an outer diametric dimension of epoxy 50. The portion of the conductor 1 extending out of epoxy 55 provides a connection to an anode within a plasma reactor.

Although FIG. 14 illustrates that epoxy 55 only surrounds the conductor 1, epoxy 55 may also surround a portion of the power cable 100. Moreover, it is noted that epoxy 50 and epoxy 55 may be constructed of distinct epoxies or constructed of the same epoxy.

Figure 15:
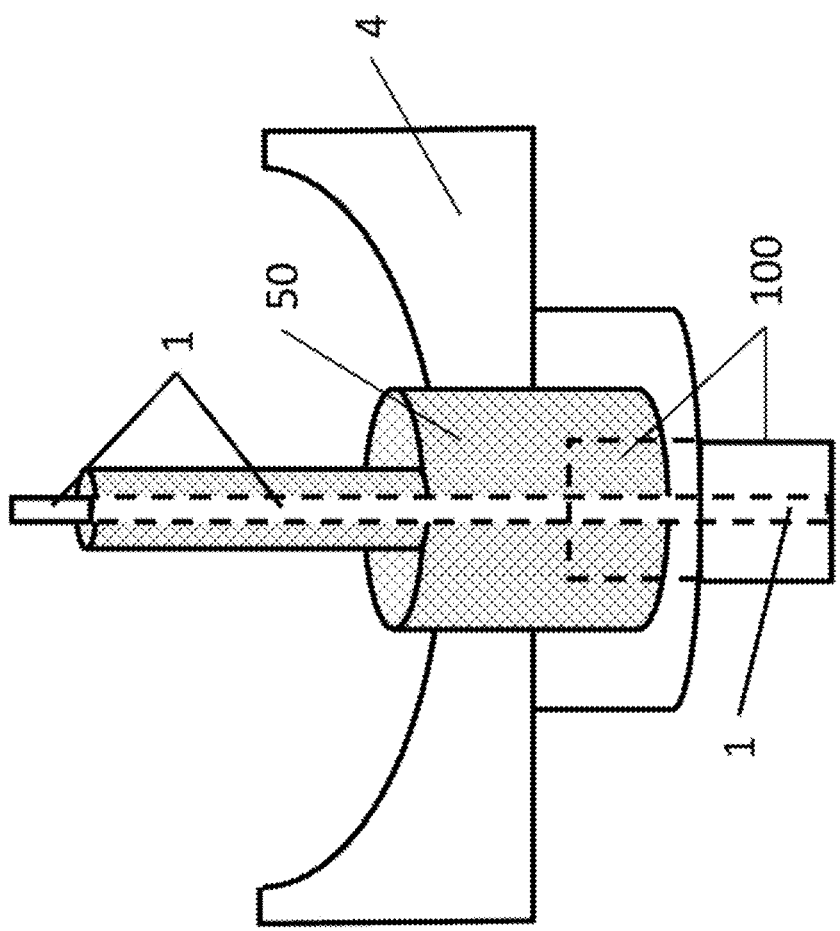
FIG. 15 illustrates an example of an epoxy coated cable interfacing with a transfer module for a non-thermal plasma generation chamber.

FIG. 15 illustrates an example of an epoxy coated cable interfacing with a transfer module for a non-thermal plasma generation chamber. As illustrated in FIG. 15, a power cable 100, having a conductor 1 therein, extends into a portion of epoxy 50. The conductor 1 therein extends, from an end portion of the power cable 100, through epoxy 50. Epoxy 50 fills a well (not shown) within the transfer module 4 and extends beyond the transfer module 4 into a reactor (not shown).

As illustrated in FIG. 15, epoxy 50 surrounds the power cable 100 and the conductor 1, wherein a portion of epoxy 50 that only surrounds the conductor 1 and has a smaller outer diametric dimension than an outer diametric dimension of the portion of epoxy 50 that surrounds the power cable 100. The portion of the conductor 1 extending out of epoxy 50 provides a connection to an anode within a plasma reactor.

Figure 16:
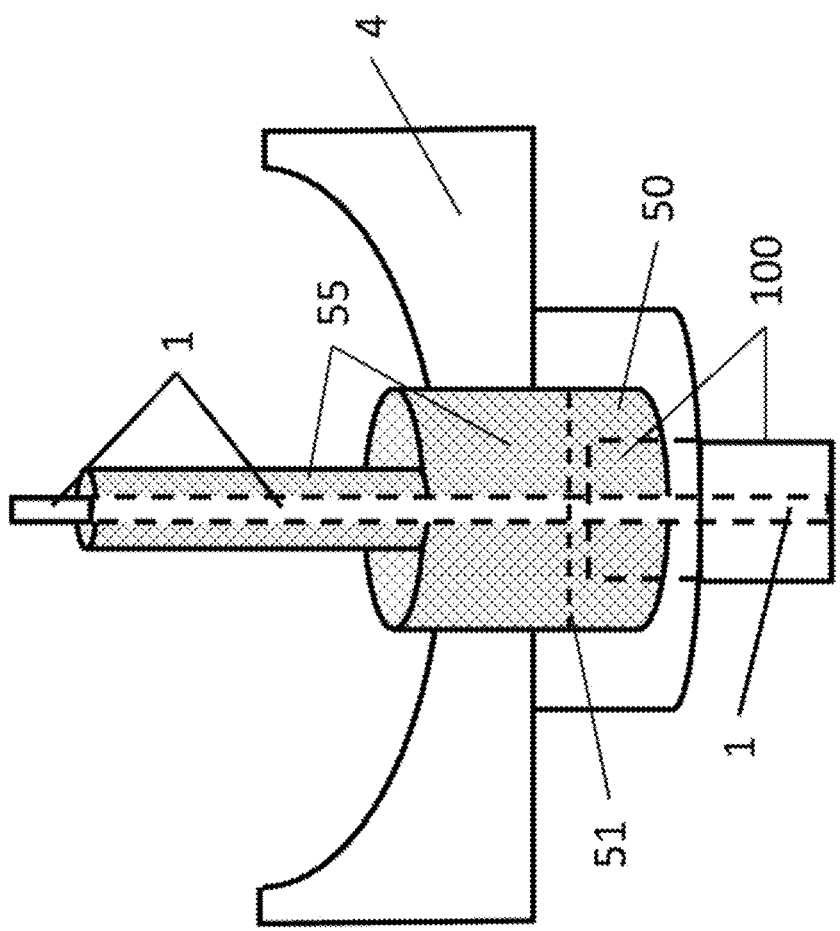
FIG. 16 illustrates another example of an epoxy coated cable interfacing with a transfer module for a non-thermal plasma generation chamber.

FIG. 16 illustrates a transfer module for a non-thermal plasma generation chamber. As illustrated in FIG. 16, a power cable 100, having a conductor 1 therein, extends into a portion of an epoxy 50. The conductor 1 therein extends, from an end portion of the power cable 100, through an epoxy 55.

Epoxy 50 fills a portion of a well (not shown) within a transfer module 4. Epoxy 55 fills a remaining portion of the well (not shown) within the transfer module 4 and extends beyond the transfer module 4 into a reactor (not shown).

As illustrated in FIG. 16, epoxy 50 surrounds the power cable 100 and a portion of the conductor 1. Epoxy 55 surrounds another portion of the conductor 1, wherein a portion of epoxy 55 has a smaller outer diametric dimension than an outer diametric dimension of a portion of the epoxy 55 that fills the remaining portion of the well (not shown) within the transfer module 4. The portion of the conductor 1 extending out of epoxy 55 provides a connection to an anode within a plasma reactor.

Although FIG. 16 illustrates that epoxy 55 surrounds a portion of the power cable 100 and the conductor 1, epoxy 55 may be limited to only surrounding the conductor 1. Moreover, it is noted that epoxy 50 and epoxy 55 may be constructed of distinct epoxies or constructed of the same epoxy.

Figure 17:
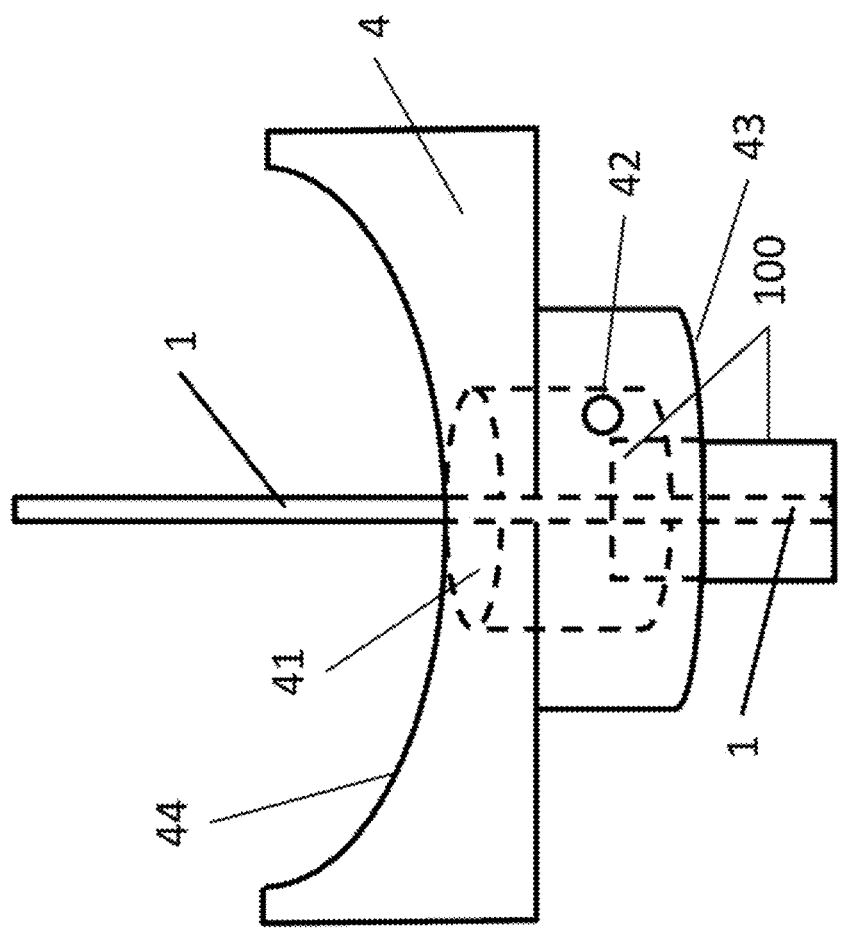
FIG. 17 illustrates a transfer module for a non-thermal plasma generation chamber.

FIG. 17 illustrates a transfer module for a non-thermal plasma generation chamber. As illustrated in FIG. 17, a transfer module 4 includes a well 41, which may have an interior diameter greater than an outer diameter of a power cable 100. A fill hole 42 provides a channel between a volume of the well 41 and an outer surface of the transfer module 4 such that an epoxy can be supplied to the volume of the well 41 via fill hole 42.

The power cable 100 may be located within the well 41 by passing through an opening (not shown) on a first surface 43 of the transfer module 4 which is opposite of a second surface 44 of the transfer module 4 that interfaces with a reactor (not shown). When connected to a reactor, an O-ring (as illustrated in FIG. 4) may be located between the second surface of the transfer module 4 and the reactor. The second surface of the transfer module 4 is shaped to interface an outer surface of the reactor.

Figure 18:
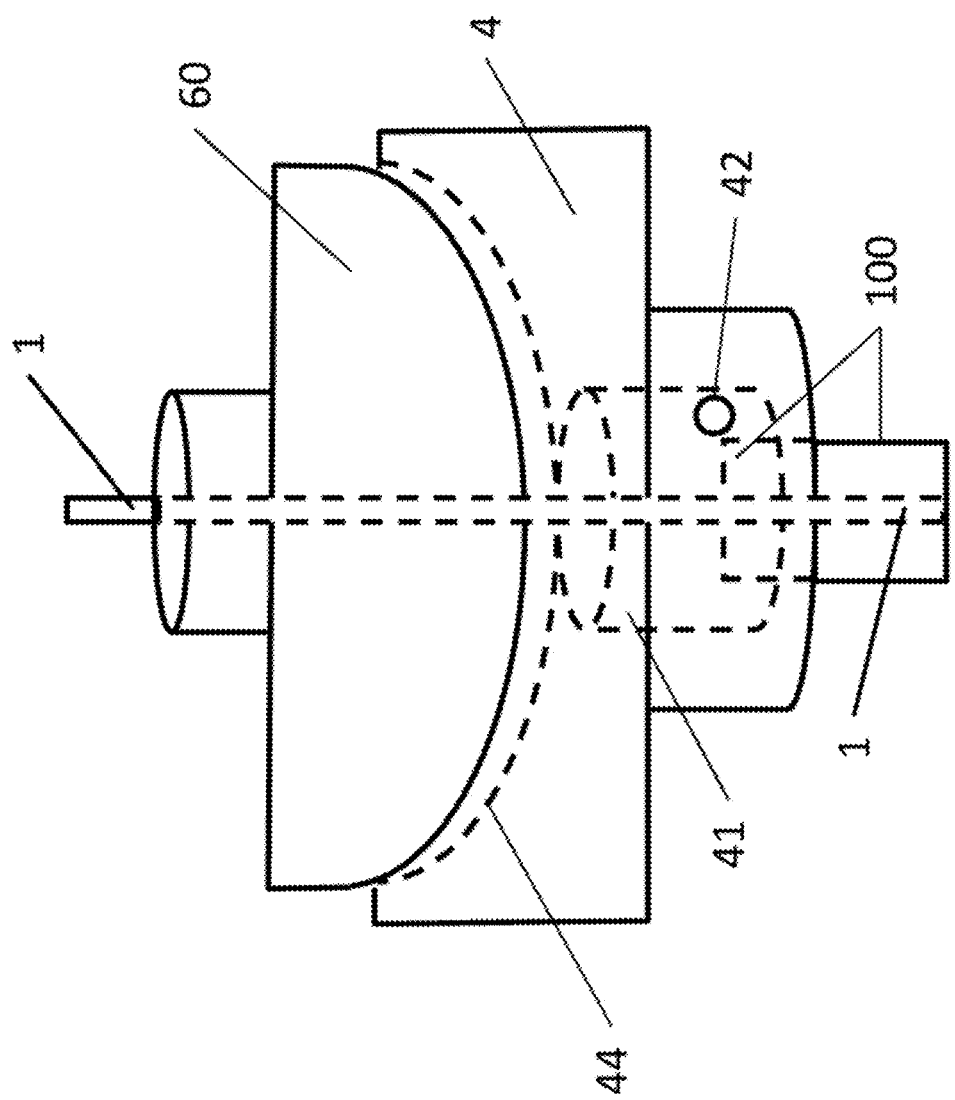
FIG. 18 illustrates a transfer module for a non-thermal plasma generation chamber and a mold for coating a cable.

FIG. 18 illustrates a transfer module for a non-thermal plasma generation chamber and a mold for coating a power cable therein. As illustrated in FIG. 18, a transfer module 4 includes a well 41, which may have an interior diameter greater than an outer diameter of a power cable 100. A fill hole 42 provides a channel between a volume of the well 41 and an outer surface of the transfer module 4 such that an epoxy can be supplied to the volume of the well 41 via fill hole 42.

The power cable 100 may be located within the well 41 by passing through an opening (not shown) on a first surface 43 of the transfer module 4 which is opposite of a second surface 44 of the transfer module 4 that interfaces with a reactor (not shown). When connected to a reactor, an O-ring (as illustrated in FIG. 4) may be located between the second surface of the transfer module 4 and the reactor. The second surface of the transfer module 4 is shaped to interface an outer surface of the reactor.

FIG. 18 further illustrates a mold 60, shaped to interface with second surface 44 of the of the transfer module 4. The mold 60 includes a well or channel (not shown) that creates a volume around conductor 1.

The well or channel (not shown) may have two different interior diameters such that a first diameter closest to the second surface of the transfer module 4 is greater than a second diameter furthest from the second surface of the transfer module 4. The first diameter may be greater than the outer diameter of power cable 100. The second diameter may be greater than an outer diameter of conductor 1. Preferably, first diameter is equal to the interior diameter of the well 41.

Figure 19:
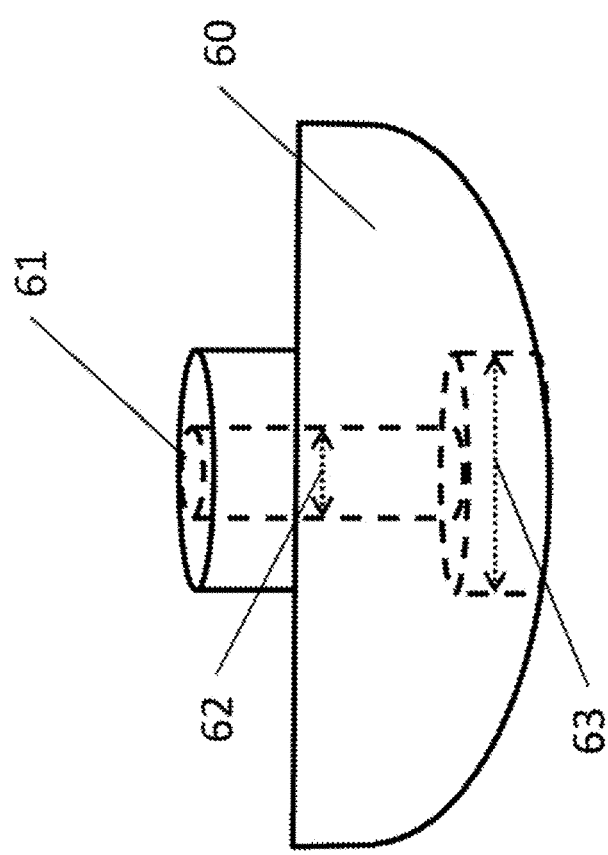
FIG. 19 illustrates a mold for coating a cable.

FIG. 19 illustrates a mold for coating a power cable therein. As illustrated in FIG. 19, a mold 60 includes a well or channel 61 that creates a volume. The well or channel 61 has two different interior diameters such that a first diameter 63 is greater than a second diameter 62. The first diameter 63 may be greater than an outer diameter of a power cable. The second diameter 62 may be greater than an outer diameter of a conductor. Preferably, first diameter 63 is equal to an interior diameter of a well in a transfer module.

FIG. 20 illustrates an example of an epoxy coated cable interfacing with a transfer module for a non-thermal plasma generation chamber (reactor). As illustrated in FIG. 20, a power cable 100, having a conductor 1 therein, extends into a portion of an epoxy 50. The conductor 1 therein extends, from an end portion of the power cable 100, through an epoxy 55.

Epoxy 50 fills a portion of a well 41 within a transfer module 4. As illustrated in FIG. 20, epoxy 50 fills a portion of a well 41 within a transfer module 4 to just below fill hole 42 to create an interface or boundary 51. The well 41 within a transfer module 4 provides a connecting interface for a loom connector (6 of FIG. 5) associated with the power cable 100.

Epoxy 55 fills a remaining portion of the well 41 within the transfer module 4 and extends, via the mold of FIG. 19 (not shown), beyond the transfer module 4 into a reactor (not shown).

As illustrated in FIG. 20, epoxy 50 surrounds the power cable 100 and a portion of the conductor 1. Epoxy 55 surrounds another portion of the conductor 1, wherein a portion of epoxy 55 has a smaller outer diametric dimension than an outer diametric dimension of a portion of the epoxy 55 that fills the remaining portion of the well 41 within the transfer module 4. The portion of the conductor 1 extending out of epoxy 55 provides a connection to an anode within a plasma reactor.

Although FIG. 20 illustrates that epoxy 55 does not surround a portion of the power cable 100 and the conductor 1, epoxy 55 may be extended to surround the power cable 100. Moreover, it is noted that epoxy 50 and epoxy 55 may be constructed of distinct epoxies or constructed of the same epoxy.

The overmolded power cable of FIG. 20 can be constructed using the following method. More specifically, the overmolded power cable is molded in two part epoxy creating a sealed probe, with minimal porosity (air gaps or pockets), creating an overmolded probe.

To construct an overmolded probe, a fill port (42 of FIG. 17) is created in the transfer module/plate (4 of FIG. 17) and then the well (cavity) (41 of FIG. 17) in the transfer module/plate (4 of FIG. 17) is filled with epoxy (50 of FIG. 20) up to or just below the fill port (42 of FIG. 17). Thereafter, a polyethylene mold (60 of FIG. 18) is placed on the transfer module/plate (4 of FIG. 17) to provide a cavity for a second epoxy fill (55 of FIG. 20).

It is noted that several vent holes may be drilled into the polyethylene mold (60 of FIG. 18) from the top down to allow air to escape during the second epoxy fill (55 of FIG. 20). It is further noted that the banana part of the terminal may be wrapped with silicone tape to prevent epoxy (55 of FIG. 20) flow into the banana.

During the second epoxy fill, epoxy (55 of FIG. 20) is injected into the fill port (42 of FIG. 17) in the transfer module/plate (4 of FIG. 17). Once the second epoxy fill is cured (55 of FIG. 20), the polyethylene mold (60 of FIG. 18) is removed, thereby creating a power transfer module with an overmolded probe.

The overmolded probe, which is used to transfer power to the reactor, has an additional thin layer of two part epoxy covering everything to minimize any air gaps due to variability in components (tolerances).

The various power cable configurations, discussed above, enable power transfer for application of non-thermal plasma for: (1) the treatment of exhaust from internal combustion engines; and/or (2) the treatment of exhaust from other sources of applied energy, such as stationary power plants. The various power cable configurations, discussed above, also enable the transfer of power from any high voltage source to the generation of non-thermal plasma or to any other system demanding a combination of high voltage power cabling and secure entry into high temperature systems, pressurized or non-pressurized, using that power. Lastly, the various power cable configurations, discussed above, meet the requirements of (1) high voltage and current levels; (2) exhaust temperatures; exhaust pressures; (3) chemical environment; (3) insulator and conductor materials; (4) transfer module and insertion into reactor: (5) potting materials and adhesion; (6) insulator durability and anti-degradation; (7) surface energy of cable materials; (8) sealing and gasketing; (9) gaseous bleed-back prevention; (10) cable flexibility; (11) cable protection, (12) warnings and alerts; and/or (13) connections and grounding.

A power cable attached to a transfer module for a non-thermal plasma generator, comprises a conductor for conducting electrical power; an insulation layer surrounding a portion of the conductor; and an epoxy surrounding the conductor within a well within the transfer module.

The epoxy may surround the conductor outside the well within the transfer module. The epoxy may not surround a portion of the conductor located outside the well within the transfer module.

The epoxy surrounding the conductor within the well within the transfer module may have a first diameter and the epoxy surrounding the conductor outside the well within the transfer module may have a second diameter, the first diameter being greater than the second diameter.

A power cable attached to a transfer module for a non-thermal plasma generator, comprises a conductor for conducting electrical power; an insulation layer surrounding a portion of the conductor; a first epoxy; a second epoxy; and an interface between the first epoxy and the second epoxy; the first epoxy being located within a well of the transfer module to surround the insulation layer; the second epoxy being located within the well of the transfer module to surround the conductor located within the well of the transfer module; the second epoxy being located outside the well of the transfer module to surround the conductor located outside the well of the transfer module.

The second epoxy may not surround a portion of the conductor located outside the well within the transfer module.

The first epoxy surrounding the conductor within the well of the transfer module may have a first diameter and the second epoxy surrounding the conductor outside the well of the transfer module may have a second diameter, the first diameter being greater than the second diameter.

A first portion of the second epoxy surrounding the conductor may extend into the well of the transfer module, the portion of the second epoxy surrounding the conductor extending into the well of the transfer module having a first diameter, and a second portion of the second epoxy surrounding the conductor, located outside the well of the transfer module, has a second diameter, the first diameter being greater than the second diameter.

The first epoxy and the second epoxy may be a same epoxy but applied at different times, thereby creating the interface between the first epoxy and the second epoxy.

A transfer module for transferring power to a non-thermal plasma generator, comprises a power cable; epoxy; and a well; the power cable including a conductor for conducting electrical power and an insulation layer for surrounding a portion of the conductor; the epoxy having a first epoxy portion and a second epoxy portion, the first epoxy portion being located within the well to surround the insulation layer and a portion of the conductor not surrounded by the insulation layer, the second epoxy portion being located outside the well to surround the conductor.

The first epoxy portion may have a diameter equal to a diameter of the well; the second epoxy portion may have a first diameter equal to a diameter of the well and a second diameter less than the diameter of the well.

The first epoxy portion may have a diameter equal to a diameter of the well; the second epoxy portion may have a diameter less than the diameter of the well.

A transfer module for transferring power to a non-thermal plasma generator, comprises a power cable; a first epoxy; a second epoxy; an interface between the first epoxy and the second epoxy; and a well; the power cable including a conductor for conducting electrical power and an insulation layer for surrounding a portion of the conductor; the first epoxy being located within the well to surround the insulation layer; the second epoxy being located within the well to surround the conductor located within the well; the second epoxy being located outside the well to surround the conductor located outside the well.

The first epoxy may be located within the well surrounds a portion of the conductor located within the well.

The first epoxy may have a diameter equal to a diameter of the well; the second epoxy may have a first diameter equal to a diameter of the well and a second diameter less than the diameter of the well.

The first epoxy may have a diameter equal to a diameter of the well; the second epoxy may have a diameter less than the diameter of the well.

The first epoxy and the second epoxy may be a same epoxy but applied at different times, thereby creating the interface between the first epoxy and the second epoxy.

A method for constructing a transfer module with power cable for transferring power to a non-thermal plasma generator, comprises (a) drilling a fill port into the transfer module to provide a channel to a well within the transfer module: (b) inserting a power cable into the well within the transfer module, the power cable having a portion of bare conductor; (c) filling, through the fill port, a portion of the well within the transfer module with a first epoxy; (d) placing a mold, having a cavity therein, over the bare conductor of the power cable such that the cavity of the mold lines up with the well within the transfer module; and (e) filling, through the fill port, a remaining portion of the well within the transfer module and the cavity of the mold with a second epoxy.

The first epoxy may be cured before the filling, through the fill port, of the remaining portion of the well within the transfer module and the cavity of the mold with the second epoxy.

The first epoxy may fill the well within the transfer module to a level just below the fill port.

The filling, through the fill port, of the portion of the well within the transfer module with the first epoxy may coat the power cable within the well of the transfer module.

The filling, through the fill port, of the portion of the well within the transfer module with the first epoxy may coat the power cable located within the well of the transfer module and a portion of the bare conductor located within the well of the transfer module.

The filling, through the fill port, of the remaining portion of the well within the transfer module with the second epoxy may coat a portion of the bare conductor located within the well of the transfer module.

The filling, through the fill port, of the remaining portion of the well within the transfer module with the second epoxy may coat the bare conductor located within the well of the transfer module.

The first epoxy and the second epoxy may be a same epoxy.

The first epoxy and the second epoxy may be a different epoxy.

It will be appreciated that variations of the above-disclosed embodiments and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the description above and the following claims.

What is claimed is:

1. A transfer module for transferring power to a non-thermal plasma generator, comprising:
   a power cable;

epoxy; and a well;

said power cable including a conductor for conducting electrical power and an insulation layer for surrounding a portion of said conductor;

said epoxy having a first epoxy portion and a second epoxy portion, said first epoxy portion being located within said well to surround said insulation layer and a portion of said conductor not surrounded by said insulation layer, said second epoxy portion being located outside said well to surround said conductor.

2. The transfer module, as claimed in claim 1, wherein said first epoxy portion has a diameter equal to a diameter of said well:

said second epoxy portion having a diameter less than the diameter of said well.

3. A transfer module for transferring power to a non-thermal plasma generator, comprising:

a power cable;

a first epoxy;

a second epoxy:

an interface between said first epoxy and said second epoxy; and a well;

said power cable including a conductor for conducting electrical power and an insulation layer for surrounding a portion of said conductor;

said first epoxy being located within said well to surround said insulation layer;

said second epoxy being located within said well to surround said conductor located within said well;

said second epoxy being located outside said well to surround said conductor located outside said well.

4. The transfer module, as claimed in claim 3, wherein said first epoxy being located within said well surrounds a portion of said conductor located within said well.

5. The transfer module, as claimed in claim 3, wherein said first epoxy has a diameter equal to a diameter of said well;

said second epoxy having a first diameter equal to a diameter of said well and a second diameter less than the diameter of said well.

6. The transfer module, as claimed in claim 3, wherein said first epoxy has a diameter equal to a diameter of said well;

said second epoxy having a diameter less than the diameter of said well.

7. The transfer module, as claimed in claim 3, wherein said first epoxy and said second epoxy are a same epoxy but applied at different times, thereby creating said interface between said first epoxy and said second epoxy.

8. The transfer module, as claimed in claim 1, wherein said first epoxy portion has a diameter equal to a diameter of said well;

said second epoxy portion having a first diameter equal to a diameter of said well and a second diameter less than the diameter of said well.

* * * * *